(12) United States Patent
Suzuki et al.

(10) Patent No.: US 6,356,032 B1
(45) Date of Patent: Mar. 12, 2002

(54) ORGANIC ELEMENT WITH METALLIC CATHODE

(75) Inventors: Harumi Suzuki, Kariya; Masao Nagakubo, Nishikamo-gun, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/651,077

(22) Filed: Aug. 30, 2000

(30) Foreign Application Priority Data

Sep. 8, 1999 (JP) .............................. 11-254493
Jul. 26, 2000 (JP) ........................ 2000-225774

(51) Int. Cl.[7] .............................................. G09G 3/10
(52) U.S. Cl. .............................. 315/169.3; 315/169.1; 257/40; 313/504; 345/205
(58) Field of Search ........................... 315/169.1, 169.3; 257/40; 313/504

(56) References Cited

U.S. PATENT DOCUMENTS

| | | | |
|---|---|---|---|
| 5,739,545 A | | 4/1998 | Guha et al. .................. 257/40 |
| 5,747,930 A | * | 5/1998 | Utsugi ..................... 315/169.3 |
| 5,834,894 A | * | 11/1998 | Shirasaki et al. ............ 313/509 |
| 6,037,718 A | * | 3/2000 | Nagami .................... 315/169.3 |
| 6,046,543 A | * | 4/2000 | Bulovic et al. .............. 313/504 |
| 6,246,179 B1 | * | 6/2001 | Yamada .................... 315/169.3 |
| 6,307,324 B1 | * | 10/2001 | Hirano et al. ............. 315/169.3 |

FOREIGN PATENT DOCUMENTS

| | | | |
|---|---|---|---|
| EP | 845924 | 6/1998 | ........... H05B/33/28 |
| JP | 8-185984 | 7/1996 | ........... H05B/33/28 |
| JP | B2-2770013 | 4/1998 | ........... H05B/33/28 |

* cited by examiner

*Primary Examiner*—Don Wong
*Assistant Examiner*—Jimmy T Vu
(74) *Attorney, Agent, or Firm*—Law Offices of David G. Posz (57) ABSTRACT

An organic EL element has an anode made of transparent conductive material such as ITO and a cathode made of metallic material such as Al. Further, a hole injection layer, a hole transport layer, an electron transport layer, and an electron injection layer are disposed between the anode and the cathode. The cathode is composed of a thin film layer and a thick film layer partially overlapping with the thin film layer. The thin film layer can transmit light and the thick film layer can suppress an increase in wiring resistance of the cathode.

25 Claims, 6 Drawing Sheets

ORGANIC ELEMENT WITH METALLIC CATHODE

CROSS REFERENCE TO RELATED APPLICATIONS

This application is based upon and claims the benefit of Japanese Patent Applications No. 11-254493 filed on Sep. 8, 1999, and No. 2000-225774 filed on Jul. 26, 2000, the contents of which are incorporated herein by reference.

BACKGROUND OF THE INVENTION

1. Field of the Invention

This invention relates to an organic electroluminescent (EL) element that is transparent or translucent when the element does not emit light.

2. Description of the Related Art

A luminous type transparent (or translucent) display panel is conventionally applied to a vehicle meter by being disposed at the front (driver side) of the meter. In this case, a light emitting part of the transparent display panel provides a message to a driver, which can be visually observed by the driver. When the panel does not emit light, i.e., at a non-emitting state, the meter disposed behind the panel can be visually observed because the panel is transparent.

An inorganic EL element is used as such a transparent display panel. The inorganic EL element is typically composed of a luminescent layer made of inorganic material such as ZnS:Mn and two electrode films made of a transparent conductive material such ITO (indium tin oxide) and interposing the luminescent layer therebetween, thereby providing a transparent structure.

In addition to the inorganic EL element, there is known an organic EL element including a luminescent layer containing an organic compound that is provided between a cathode and an anode. While the inorganic EL device necessitates several hundreds volts as a drive voltage, the organic EL element can be driven at a low voltage of several volts to several tens volts. Therefore, the organic EL device can be provided together with a drive circuit readily with a lightened weight at low cost. Incidentally, the organic EL device is driven with direct current.

A widely known material for the anode of the organic EL element is transparent conductive ITO. Light is generally emitted from this ITO electrode side. The cathode is generally composed of a metal layer made of Mg—Ag (alloy of magnesium and silver) or Al/LiF (lamination structure composed of an aluminum layer and a lithium fluoride layer).

When the organic EL element is applied to a transparent display panel, the cathode should be made transparent. However, the cathode is required to have a capability (work function) for supplying electrons into the luminescent layer. This makes it difficult to simply replace the metallic film with a transparent conductive film such as an ITO film.

In this connection, it is conceivable that the metallic film for the cathode is thinned to have a thickness (for instance, approximately 10 nm) sufficient for transmitting light. However, thinning the metallic film increases wiring resistance of the cathode, and reduces an amount of current supplied into the luminescent layer. The decreased amount of current might be insufficient for making the luminescent layer emit light. In such a case, current supplied from the drive circuit needs to be increased to compensate the decreased amount of current, thereby increasing the cost at the drive circuit side.

Especially when the organic EL element is constructed for a matrix type panel, a wiring length of the cathode is increased as a distance from a terminal portion positioned at the periphery of the panel is increased. Therefore, the increase in wiring resistance is prominent as the distance from the terminal portion is increased, and produces variation in amount of current supplied to pixels in accordance with the wiring length. This results in malfunctions of the panel such as nonuniformity of brightness.

As another countermeasure for making the organic EL element transparent, there is known a method for making the organic EL device translucent by thinning the cathode material to a thickness capable of transmitting light, and simultaneously for decreasing wiring resistance of the cathode by disposing a transparent conductive film such as ITO on the cathode (JP-A-8-185984, JP-A-10-294182, and JP 270013). In this method, however, organic layers are readily damaged by plasma charged particles, rise in temperature of a substrate and the like during the formation of the ITO to impair element characteristics.

To the contrary, JP-A-10-223377 proposes a method for reducing damage to the organic layers by forming the transparent conductive film not from ITO but from ZnSe or ZnS that can be formed by vapor deposition. In this method, however, an ITO film is further formed on the transparent conductive film, which serves as a damage preventive barrier for the organic layers, to further reduce resistance. Therefore, the element structure is complicated, and the damage to the organic layers is not prevented completely. Another structure is proposed using this method, in which an Al layer is disposed on the transparent conductive film made of ZnSe or the like. However, the transparency of this structure is insufficient.

SUMMARY OF THE INVENTION

The present invention has been made in view of the above problems. An object of the present invention is to provide an organic EL element with sufficient transparency and low wiring resistance of a cathode.

According to an organic EL element of the present invention, a cathode has a thin film region having a first thickness capable of transmitting light, and a thick film region having a second thickness thicker than the first thickness. The thin film region makes the EL element transparent, and the thick film region suppresses an increase in wiring resistance of the cathode.

Preferably, the first thickness is in a range of approximately 5 nm to approximately 50 nm. Preferably, a ratio in area of the thick film region with respect to a light emitting region of the luminescent layer is less than approximately 70%. A transparent electrode can be further provided on a surface of the cathode at an opposite side of the anode.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS (First Embodiment)

Figure 1:
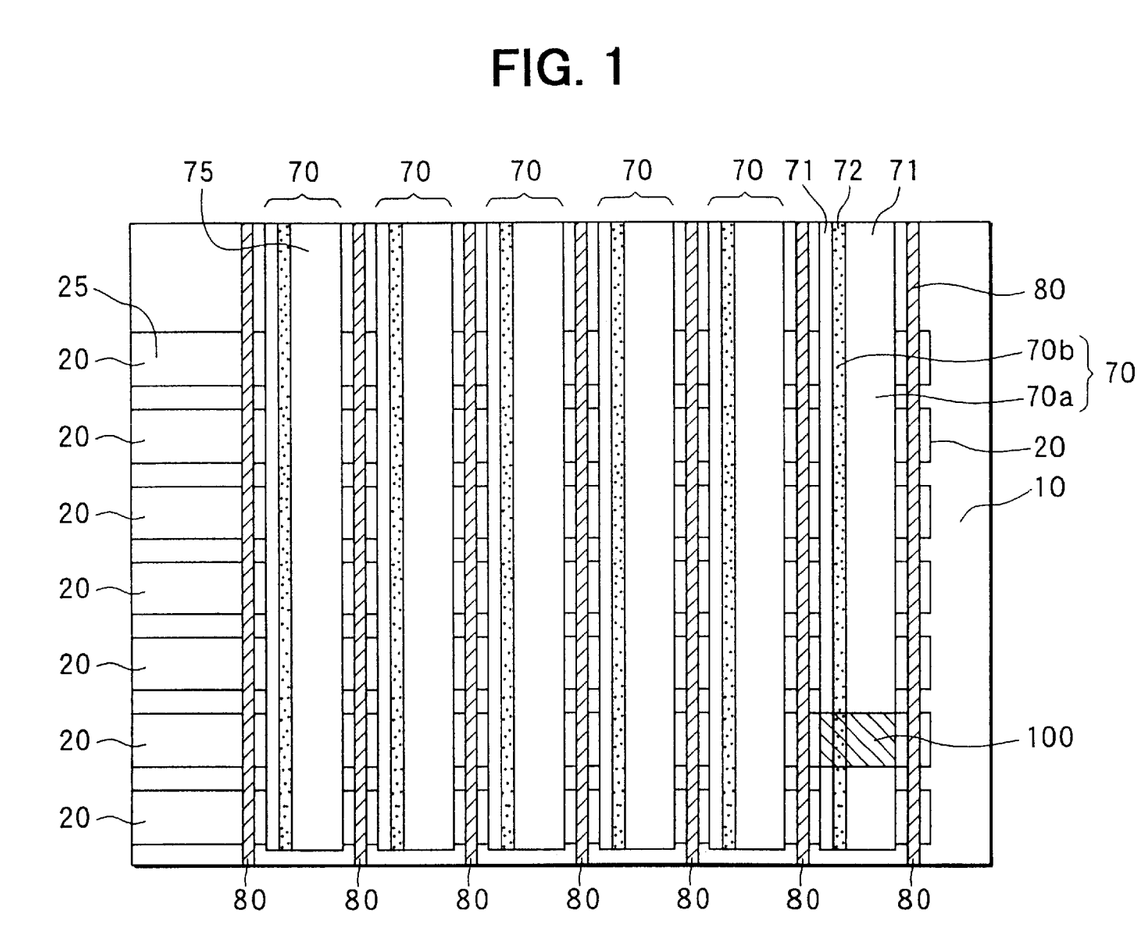
FIG. 1 is a plan view showing a transparent display panel using an organic EL device in a first preferred embodiment according to the present invention.
Figure 2:
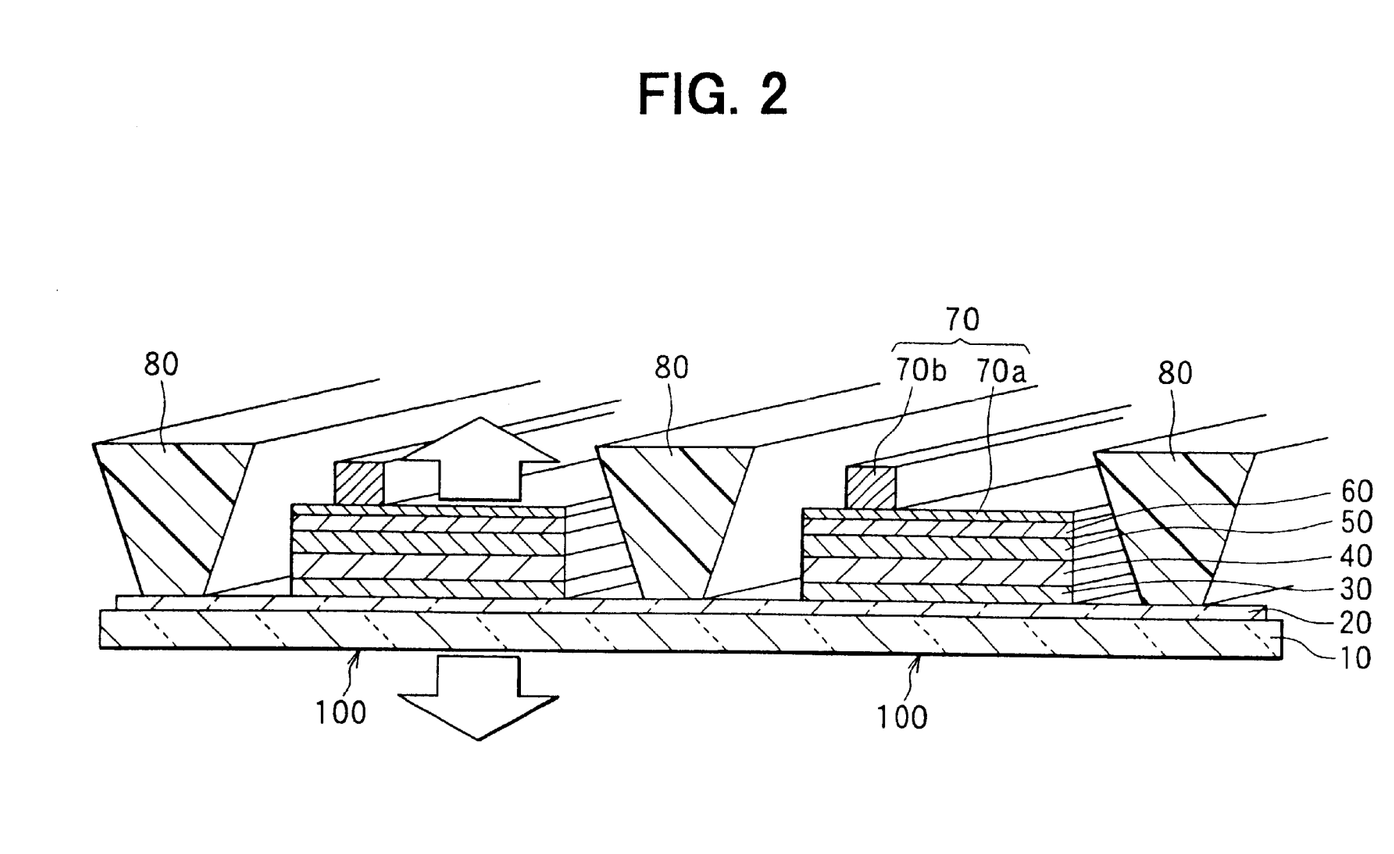
FIG. 2 is a cross-sectional view showing the organic EL element in the first embodiment.

An organic EL element 100 in a first preferred embodiment is used for a transparent display panel. Referring to FIGS. 1 and 2, the organic EL element 100 has a lamination structure in which an anode 20, a hole injection layer 30, a hole transport layer 40, an electron transport layer 50, an electron injection layer 60, and a cathode 70 are disposed on a glass substrate 10 one after another. The anode 20 is formed into several stripes arranged on the glass substrate 10 with a specific width (640 $\mu$m in this embodiment) and at a specific pitch (700 $\mu$m in this embodiment). Each of the layers 30–70 disposed above the anode 20 is also formed into several stripes arranged with a specific width (640 $\mu$m in this embodiment) and at a specific pitch (700 $\mu$m in this embodiment) across the anode 20 perpendicularly.

The stripes of the layers 30–70 are divided by stripe-like partition walls 80 made of resin such as a resist material. Plural regions where the anode 20 and the layers 30–70 overlap, i.e., cross, with one another are constructed as generally rectangular pixels (640 $\mu$m×640 $\mu$m in this embodiment) of the panel. Here, it should be noted that each pixel constitutes one EL element 100 in this embodiment, and the constitution of the EL element is described below in detail.

The anode 20 is a conductive transparent film formed by depositing a transparent conductive material such as ITO on the substrate 10. In this embodiment, the anode 20 is an ITO film having a thickness of approximately 140 nm. The hole injection layer 30 and the hole transport layer 40 are made of organic compounds having a hole transporting property. In this embodiment, the hold injection layer 30 is made of CuPc (phthhalocyanine with copper coordination) having a thickness of approximately 15 nm, and the hole transport layer 40 is made of TPTE (tetratriphenylamine) having a thickness of approximately 40 nm.

The electron transport layer 50 serves as a luminescent layer, and is made of an organic main material having an electron transporting property, and a fluorescent material (pigment) doped into the main material. Specifically, the electron transport layer 50 is composed of a layer formed by depositing Alq (8-quinolinol aluminum complex) as a main material with a thickness of approximately 60 nm, approximately 40 nm of which is doped with quinacridone that emits green light. The electron injection layer 60 is an LiF layer having a thickness of approximately 0.5 nm.

The cathode 70 is a metallic film formed by vapor deposition. In this embodiment, the cathode 70 is an Al film but may be made of other materials such as Mg—Ag, copper, thin, or the like. The cathode 70 is composed of a thin film region 71 having a thin thickness for transmitting light and a thick film region 72 for suppressing an increase in wiring resistance. In this embodiment, a thin film layer 70*a* is provided, as the thin film region 71, at a side of the electron injection layer 60, and a thick film layer 70*b* is partially disposed on the thin film layer 70*a* to form the thick film region 72.

The thin film layer 70*a* is formed into a stripe-like shape with a width that is substantially the same as that of the organic layers 30–60, and the thick film layer 70*b* is formed into a stripe-like shape with a width that is smaller than that of the layers 30–60. The portion where only the thin film layer 70*a* exists constitutes the thin film region 71, and the lamination portion where both the thin film layer 70*a* and the thick film layer 70*b* exist constitutes the thick film region 72. In this embodiment, the thickness of the thin film layer 70*a* is approximately 10 nm, while the thickness of the thick film layer 70*b* is approximately 800 nm. Therefore, the thickness of the thick film region 82 is approximately 810 nm.

The thickness of the thin film layer 70*a* is not limited to 10 nm, but may be selected from a range of approximately 5 nm to approximately 50 nm. When the thickness of the thin film region 71 falls in the range of approximately 5 nm to 50 nm, the thin film region 71 can have a transmittance in a range of approximately 30% to 80% in practical use. If the metallic film (Al, Mg—Ag, copper, or thin) for the cathode 70 is 5 nm in thickness, the transmittance of the film is approximately 80%, and if the metallic film is 50 nm in thickness, the transmittance of the film is approximately 30%.

Likewise, the thickness of the thick film layer 70*b* is not limited to 800 nm so long as it suppresses the increase in wiring resistance of the cathode 70 appropriately. For instance, the thickness of the thick film layer 70*b* can be selected from a range of approximately 100 nm to approximately 1000 nm. If the thickness of the thick film layer 70*b* is smaller than 100 nm, the layer 70*b* does not prevent the increase in wiring resistance sufficiently. If the thickness of the thick film layer 70*b* is larger than 1000 nm, the layer 70*b* might be separated from the underlying layer due to an internal stress thereof.

As to a ratio in area between the thin film layer 70*a* and the thick film layer 70*b* in the cathode, it is preferable that the ratio of the thick film region 72 is less than approximately 70% with respect to an entire area of one pixel, which is hatched in FIG. 1, i.e., with respect to an entire light emitting area of the EL element 100 where the electron transport layer (luminescent layer) 50 can emit light. The ratio of the thick film region 72 is changeable if it is less than approximately 70%, in accordance with the target transmittance of the thin film region 71. If the above ratio in area is larger than 70%, the transmittance of each pixel is so lowered that light passing through the element 100 cannot be visually observed at the non-emitting state.

In the present embodiment, the transmittance of the one pixel as a whole is controlled to be approximately 60% or more when the ratio in area of the thick film region 72 (the thick film layer 70*b*) with respect to the entire area (640 $\mu$m×640 $\mu$m) of the one pixel is 10% (640 $\mu$m×64 $\mu$m), the transmittance of the thick film region 72 is approximately zero, and the transmittance of the thin film region 71 is 77%.

Figure 3A:
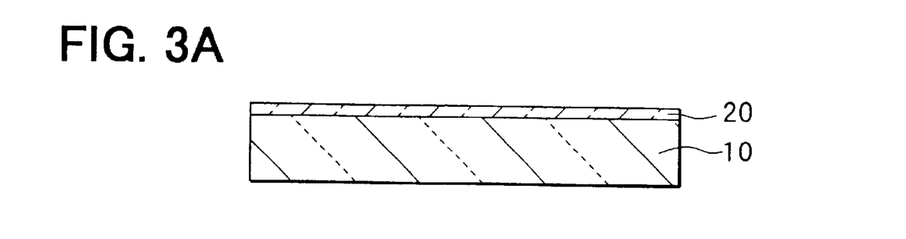
FIGS. 3A to 3D are cross-sectional process drawings showing a method for manufacturing the organic EL element in the first embodiment.
Figure 3B:
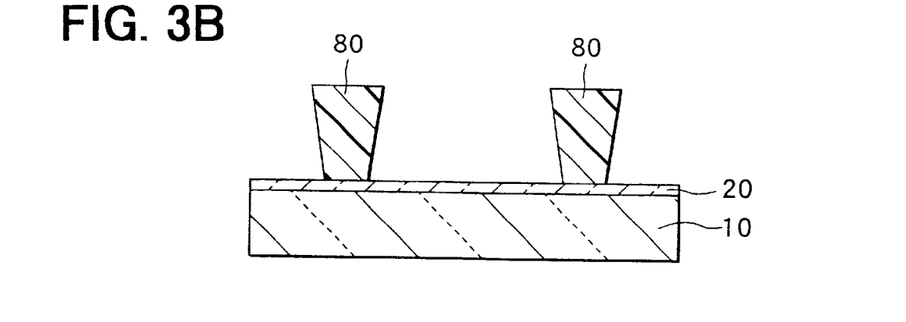

Next, a method for manufacturing the organic EL element 100 described above and the transparent display panel using the EL element 100 is explained referring to FIGS. 3A to 3D. First, as shown in FIG. 3A, an ITO film is deposited on the glass substrate 10 with a specific thickness, and is patterned by a photo process. Accordingly the stripe-shaped anode 20 is formed. Next, a resin film is formed by coating a resist material, and is patterned by a photo process implemented with exposure and development. Accordingly, as shown in FIG. 3B, the stripe-shaped partition walls 80 are formed to isolatedly form the element 100. Successively, the hole injection layer 30, the hole transport layer 40, the electron transport layer 50, and the electron injection layer 60 are formed by a vapor deposition method one after another.

The thus formed member is put in a vacuum chamber for forming the cathode 70. First, the thin film layer 70a is formed with a predetermined thickness by depositing Al. After that, a mask having an opening portion pattern is aligned on the thin film layer 70a by manipulation externally performed without breaking vacuum of the chamber, and the thick film layer 70b is formed through the mask by depositing Al.

The thick film layer 70b is formed to have lines arranged at a given pitch equal to the pitch of the pixels (the pitch of the thin film layer 70a) through the mask. The alignment accuracy of the mask for forming the thick film layer 70b is sufficient to correspond to approximately the pixel size (for instance, several hundreds μm) since the transmittance of each pixel is not affected by the position of each line of the thick film layer 70b within the pixel. In this process, the thick film layer 70b is formed after the thin film layer 70a is formed. If the order of the formations is made opposite, the thin film layer 70a might be damaged or broken due to steps produced by the thick film layer 70b. The damages or breakage of the thin film layer 70a impairs the contact property.

Figure 3C:
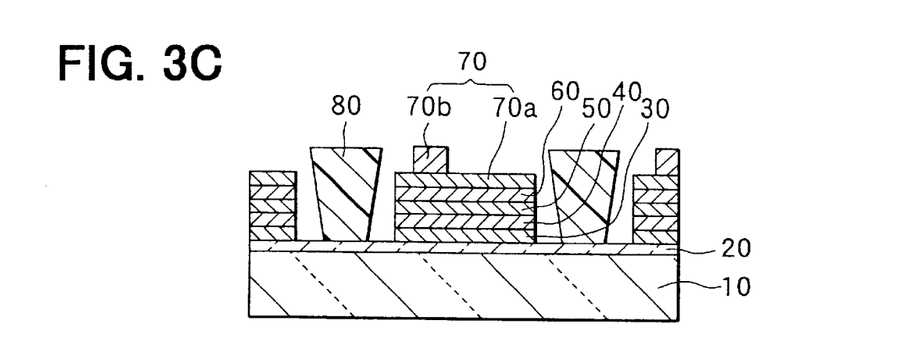
Figure 3D:
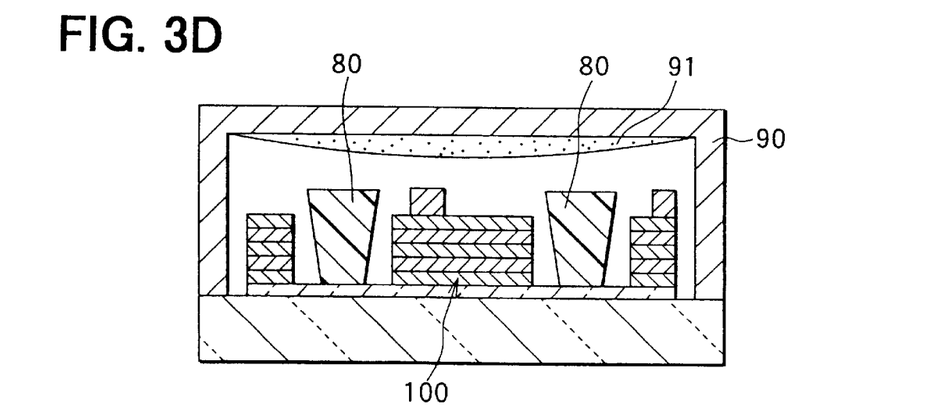

Accordingly, as shown in FIG. 3C, the laminating layers 30–70 are disposed between two adjacent partition walls 80, thereby completing the organic EL element 100 and the panel. Incidentally, as shown in FIG. 3D, the panel is covered with a sealing can 90 made of stainless or the like. Moisture absorbent 91 such as barium oxide (BaO) is fixed to the sealing can 90 by adhesive or the like, and the inner space of the sealing can 90 is filled with nitrogen gas. Thus, the element portion of the panel is sealed and protected externally.

Referring back to FIG. 1, in the organic El element 100 manufactured as above, parts of the anode 20 and the cathode 70 positioned at the periphery of the panel are used as terminal portions 25 and 75 across which a direct voltage is applied from an external circuit for driving with a predetermined duty ratio. When the voltage is applied across the anode 20 and the cathode 70, holes moves from the anode 20 toward the electron transport layer 50 and electrons moves from the cathode 70 toward the electron transport layer 50, and holes and electrons recombine in the doped layer of the electron transport layer 50 while discharging energy. The fluorescent material (quinacridone) in the electron transport layer 50 emits light upon receiving the energy.

In the present embodiment, the cathode 70 is composed of the thin film region 71 that is thin sufficiently for transmitting light, and the thick film region 72 that is thick sufficiently for suppressing the increase in wiring resistance. Because of this, the element 100 can be made transparent due to the thin film region while preventing the increase in wiring resistance due to the thick film region 72. Here, it should be noted that the cathode 70 is made of only metallic film materials.

Therefore, if the transparent organic EL element 100 of the present embodiment is installed at a front surface of a vehicle meter having a meter display, the meter display provided behind the element 100 can be visually observed at the non-emitting state of the element 100. Since the EL element 100 is made transparent, as indicated by arrows in FIG. 2, light emitted from the element 100 can be observed at either side (the anode side or the cathode side) of the glass substrate 10.

When the organic EL element 100 is applied to a matrix pixel type display panel as in the present embodiment, in the cathode 70, the wiring length is increased as a distance from the terminal portion 75 is increased. However, in the present embodiment, variation in amount of current supplied to the pixels, which is produced in accordance with the wiring length, can be suppressed since the wiring resistance of the cathodes 70 is low due to the thick film region 72. As a result, malfunctions such as nonuniformity of brightness can be prevented.

Also, according to the present embodiment, although the cathode 70 is composed of the thin film and thick film layers 70a, 70b, both the layers 70a, 70b can be formed within the same chamber successively since the layers 70a, 70b are composed of deposited metallic films. Therefore, the cost reduction can be realized in respect to a manufacturing equipment as compared to a case where a cathode is composed of a metallic film and an ITO film deposited on the metallic film by sputtering.

Figure 4A:
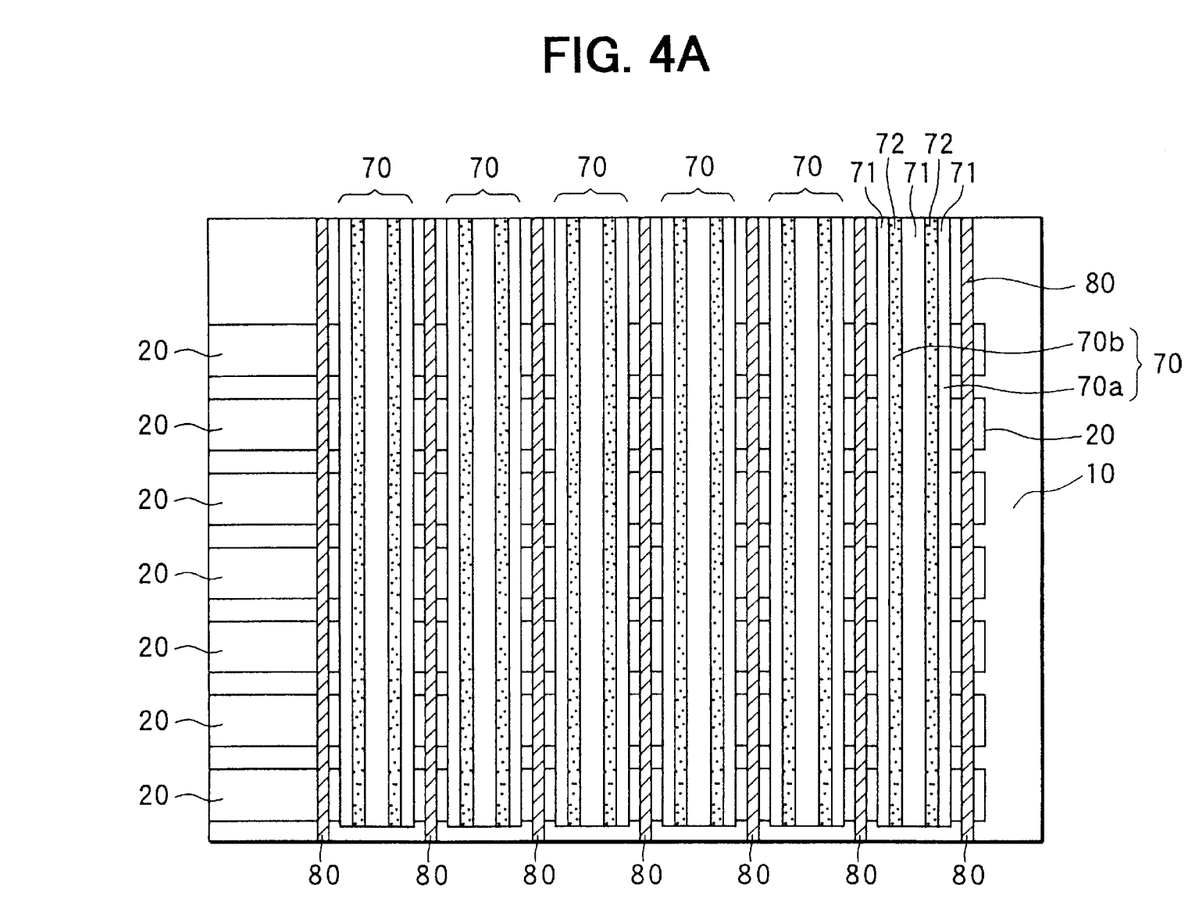
FIG. 4A is a plan view showing a modified example of the first embodiment.
Figure 4B:
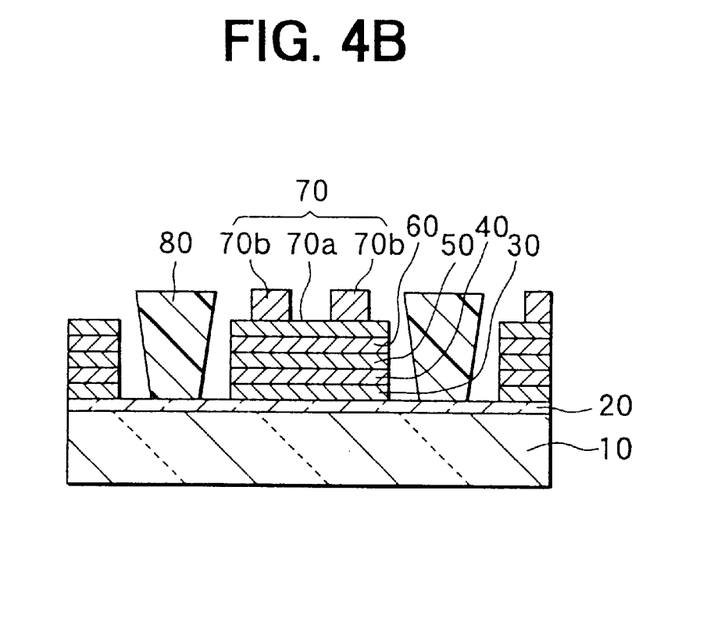
FIG. 4B is a cross-sectional view partially showing the modified example of FIG. 4A.

In the embodiment described above, one line of the thick film layer 70b is provided in each pixel. However, in case where each pixel has a larger size, more than one lines of the thick film layer 70b may be provided in each pixel. FIGS. 4A and 4B show a case where two lines of the thick film layer 70b are formed in one pixel. In this modified example, since two lines of the thick film layer 70b is provided at one pixel, electron injection efficiency with respect to the thin film layer 70a is increased. Also in this modified example, since the thickness of each line of the thick film layer 70b can be decreased, the time required for forming the thick film layer 70b can be shortened. In addition, economic efficiency of the cathode material is improved. That is, the material is not wasted.

Further, in the modified example, since several lines of the thick film region 72 are provided for one line of the cathode 70, even when one of the lines of the thick film layer 70b is broken, the other lines of the thick film layer 70b can maintain the electrical conductivity of the line of the cathode 70. As a result, reliability is improved. Even in this modified example, it is preferable that the ratio in area of the thick film region 72 with respect to the entire area of the pixel is less than approximately 70% as in the first embodiment. That is, it is preferable that the ratio of the sum area of the several lines of the thick film region 72 existing in one pixel with respect to the entire area of the one pixel is less than approximately 70%.

(Second Embodiment)

Figure 5:
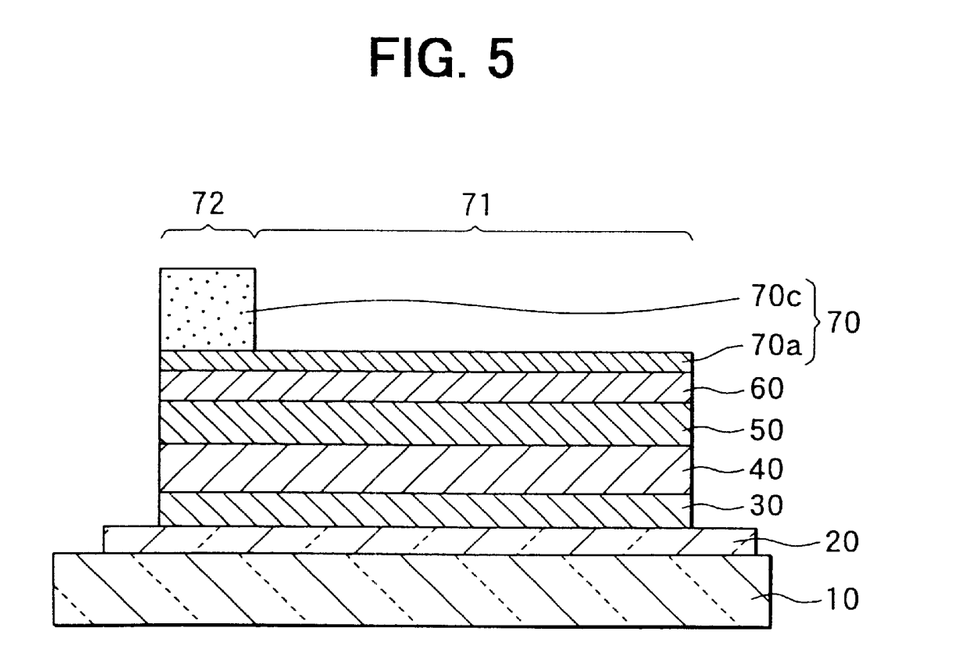
FIG. 5 is across-sectional view showing an organic EL element according to a second preferred embodiment of the present invention.

FIG. 5 shows an organic EL element in a second preferred embodiment. In the first embodiment, the layers 70a, 70b of the cathode 70 are formed from metallic films deposited with the same material (such as Al). To the contrary, in the second embodiment, a thick film layer 70c of the cathode 70 is made of a material different from that of the thin film layer 70a. That is, the material forming the thin film region 71 is different from that forming the thick film region 72. Incidentally, the same parts as those in the first embodiment are indicated with the same reference numerals.

The material for forming the thin film layer 70a is limited relatively harshly since the thin film layer 70a is required to have a specific work function for exhibiting specific characteristics in contact with the electron injection layer 60. On the other hand, the thick film layer 70b for reducing the wiring resistance does not have such limitations. Therefore, the material for forming the thick film layer 70b can be selected in consideration of conductivity, low diffusion property, transparency and reflecting performance of light, and the like.

In the second embodiment, the thin film layer 70a is made of Al, and the thick film layer 70c is made of Cu that has a reflectance lower than that of Al and high conductivity. In addition to Cu, other materials such as Ni, Mg, and Ag are applicable for the thick film layer 70c. The thin film layer 70a and the thick film layer 70c constituting the cathode 70 can be successively deposited as well.

For instance, the substrate 10 on which the organic layers 30–60 are formed is transported into the vacuum chamber for forming the cathode 70. After the thin film layer 70a is formed of Al by deposition, a mask is exchanged, and Cu is deposited partially on the thin film layer 70a to have plural lines with a specific thickness. In this embodiment, the same effects as those in the first embodiment can be provided when appropriate materials are selected for the thin film region 71 and the thick film region 72 of the cathode 70.

(Third Embodiment)

Figure 6:
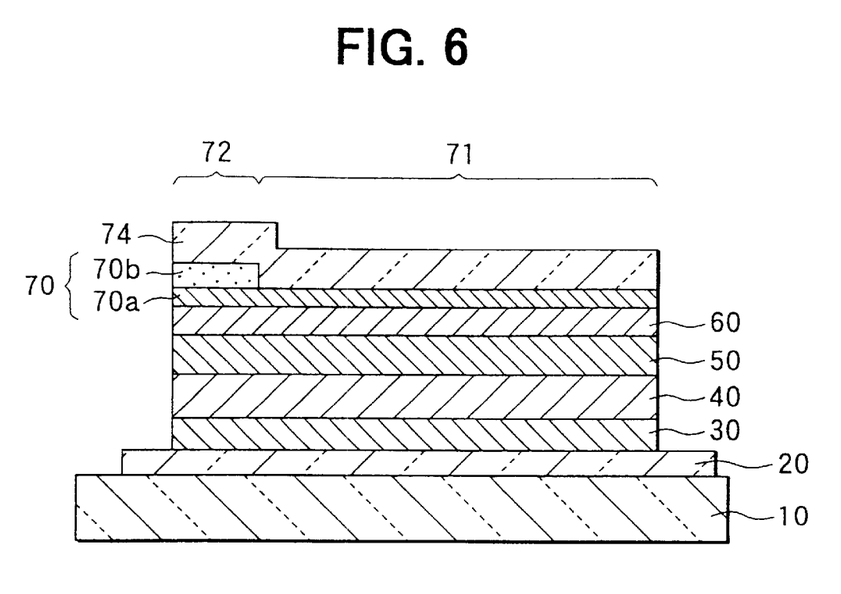
FIG. 6 is across-sectional view showing an organic EL element according to a third preferred embodiment of the present invention.

FIG. 6 shows an organic EL element according to a third preferred embodiment. In the first and second embodiments, the cathode 70 is composed of the thin film region 71 and the thick film region 72 composed of metallic films. In the third embodiment, a transparent electrode 74 is further provided on the surface of the cathode 70 at an opposite side of the anode 20. In the figure, the same parts as those in the first and second embodiments are indicated with the same reference numerals.

As shown in FIG. 6, the transparent electrode 74 is deposited on the cathode 70 composed of the metallic films. The cathode 70 is, similarly to the first embodiment, composed of the thin film layer 70a and the thick film layer 70b, thereby providing the thin film region 71 and the thick film region 72. The cathode 70 in the present embodiment is made of a metallic material such as Al or Mg—Ag. When the cathode 70 is made of Mg—Ag, for instance, it is deposited under a condition of Mg:Ag=10:1. When the cathode 70 is made of Al, for instance, the thickness of the cathode at the thin film region 71 can be controlled to be approximately 4 nm.

On the other hand, the transparent electrode 74 is made of, for instance, ITO. When the transparent electrode 74 is made of ITO, it can be deposited by sputtering with a thickness of approximately 100 nm. When the transparent electrode 74 is deposited by sputtering, the cathode 70 prevents the organic layers from being damaged during the sputtering.

The transparent electrode 74 does not impede the transparency of the element. In addition, the wiring resistance of the cathode 70 at the thin film region 71 can be lowered by the transparent electrode 74 as compared to that in the first or second embodiment. Accordingly, the electron injection efficiency into the electron injection layer 60 is improved. Further, although pinholes are liable to be formed in the thin film region 71, the transparent electrode 74 can appropriately protect and prevent the thin film region 71 from having pinholes.

Figure 7:
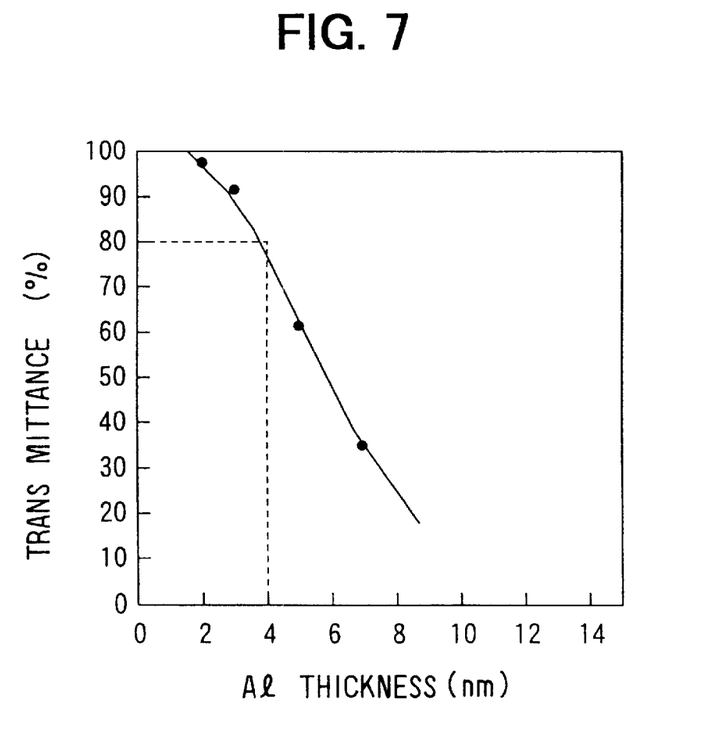
FIG. 7 is a graph showing a relation between a thickness of a cathode and a transmittance.

Here, FIG. 7 exemplifies a relation between the thickness (nm) of the thin film region 71 of cathode and the transmittance (%) of the organic EL element in the third embodiment. The result shown in FIG. 7 was obtained from the structure composed of the anode 20 made of ITO, the hole injection layer 30 made of CuPc, the hole transport layer 40 made of TPTE, the electron transport layer 50 made of Alq, the electron injection layer 60 made of LiF, the cathode 70 made of Al, and the transparent electrode 74 made of ITO which were disposed on the glass substrate 10 in this order.

The transmittance indicated in FIG. 7 is the transmittance (%) that was obtained by radiating light from a light source having a wavelength of 550 nm so that light passes through the element from the cathode side to the glass substrate side, and by being standardized using the transmittance of ITO as 100%. As shown in FIG. 7, the transmittance is reduced as the Al thickness is increased. Further, it is revealed that the transmittance of 80% can be provided when the thickness of the Al thin film region 71 (thin film layer 70a) is approximately 4 nm. In this case, the display can also be made transparent with a transmittance of approximately 70%.

The same evaluation was performed on an element structure in which the cathode 70 is made of Mg—Ag. Accordingly, it is revealed that the transmittance of 80% can be obtained even when the thickness of the thin film region is increased to approximately 6 nm. This is because Mg—Ag has a reflectance lower than that of Al. Incidentally, the thin film region 71 and the thick film region 72 may be made or different materials from each other in the third embodiment as well as in the second embodiment.

While the present invention has been shown and described with reference to the foregoing preferred embodiments, it will be apparent to those skilled in the art that changes in form and detail may be made therein without departing from the scope of the invention as defined in the appended claims.

For instance, in the first embodiment, although there exists a boundary between the thin film layer 70a and the thick film layer 70b that are made of the same material, the layers 70a, 70b may be integrated completely not to have the boundary. In this case, for instance, the cathode is formed as follows. Specifically, after a metallic film for forming the cathode is deposited to have a thickness approximately corresponding to that of the thick film region 72, the metallic film is partially etched to have the thin film region 71.

Also in the first embodiment, it is described that the ratio in area of the thick film region 72 of the cathode 70 with respect to the entire area of one light emitting region (pixel) is preferably approximately 70% at most. It should be noted that the above ratio includes 0%. This means that the thin film layer 70b or 70c may not be provided on the thin film layer 70a in the pixel. Specifically, the cathode material may be deposited with a thick thickness on an insulating spacer that is disposed between one of the partition wall 80 and the laminating layers 30–70, and serve as a thick film region. This thick film region can be electrically connected to the thin film layer 70a. Otherwise, the partition wall 80 may have a side wall protruding toward the element 100 to form a step portion on which the thick film region is formed, and a bridge may be formed between the thick film region and the thin film region.

Also, in the embodiments described above, although the thin film region 71 and the thick film region 72 have different thicknesses from each other to form a step portion, the thickness may be continuously changed from the thin film region 71 to the thick film region 72. For instance, regions 71, 72 may be tapered. Further, in the example shown in FIG. 3D, the sealing can 90 protects the element 100. However, a protective film such as a silicon nitride film may be disposed on the cathode 70 to protect the cathode 70.

In the embodiments described above, the electron transport layer (luminescent layer) 50 is made of Alq as a main material and quinacridone doped into the main material as a fluorescent material, and accordingly, it emits green light.

However, the luminescent cooler is arbitrary changeable by selecting the main material and the fluorescent material appropriately. For instance, the electron transport layer (luminescent layer) 50 may contain Alq as a main material and a red color emitting fluorescent material doped into Alq to emit red light. The red color emitting fluorescent material is, for instance, 4-dicyanomethylene-2-methyl-6-(p-dimethylaminostyryl)-4H-pyr-an (DCM1).

In the embodiments described above, while the element 100 is isolated by the partition walls 80 and is applied to the matrix pattern transparent display panel, the present invention can also be applied to a segment pattern panel to provide the same effects as described above.

What is claimed is:

1. An organic EL element comprising:

an anode composed of a transparent conductive material layer;

a cathode composed of a metallic layer; and a luminescent layer composed of an organic compound layer and disposed between the anode and the cathode, wherein the cathode has a thin film region having a first thickness, capable of transmitting light, and a thick film region having a second thickness thicker than the first thickness; and wherein the thin film region and the thick film region are arranged in a direction parallel to the luminescent layer.

2. The organic EL element of claim 1, wherein the first thickness of the thin film region is in a range of approximately 5 nm to approximately 50 nm.

3. An organic EL element comprising:

an anode composed of a transparent conductive material layer;

a cathode composed of a metallic layer; and a luminescent layer composed of an organic compound layer and disposed between the anode and the cathode, wherein the cathode has a thin film region having a first thickness, capable of transmitting light, and a thick film region having a second thickness thicker than the first thickness, wherein a ratio in area of the thick film region with respect to a light emitting region of the luminescent layer capable of emitting light is less than approximately 70%.

4. The organic EL element of claim 1, wherein:

the thin film region is made of a first material; and the thick film region is made of a second material different from the first material.

5. The organic EL element of claim 1, further comprising a transparent electrode provided on a surface of the cathode at an opposite side of the anode, the transparent electrode being made of a transparent conductive material.

6. The organic EL element of claim 1, wherein the cathode is tapered to have the first thickness and the second thickness.

7. An organic EL element comprising:

an anode composed of a conductive layer;

a cathode composed of a metallic layer; and a luminescent layer composed of an organic layer and disposed between the anode and the cathode to have a light emitting region interposed between the anode and the cathode for emitting light, wherein the cathode has a first metallic layer that is provided at a region corresponding to the light emitting region and has a first thickness for transmitting the light emitted from the light emitting region, and a second metallic layer that is connected to the first metallic layer and having a second thickness thicker than the first thickness; and wherein the cathode has a part composed of only the first metallic layer in a direction perpendicular to the luminescent layer so that the light emitted from the luminescent layer passes through the cathode.

8. The organic EL element of claim 7, wherein the second metallic layer is partially disposed on the first metallic layer not to cover an entire surface area of the first metallic layer at an opposite side of the luminescent layer.

9. The organic EL element of claim 8, wherein a ratio in area of the second metallic layer with respect to the light emitting region is less than approximately 70%.

10. The organic EL element of claim 7, wherein the first thickness of the first metallic layer is in a range of approximately 5 nm to approximately 50 nm.

11. The organic EL element of claim 7, wherein:

the first metallic layer is provided to face an entire area of the light-emitting region at a light emitting side; and the second metallic layer is provided in a vicinity of the first metallic layer not to face the light-emitting region.

12. The organic EL element of claim 7, wherein:

the first metallic layer is made of a first metallic material; and the second metallic layer is made of a second metallic material different from the first metallic material.

13. An organic EL element comprising:

a luminescent layer including an organic compound for emitting light;

an anode provided on a first surface of the luminescent layer for injecting holes into the luminescent layer; and a metallic cathode provided on a second surface of the luminescent layer at an opposite side of the anode for injecting electrons into the luminescent layer, the cathode having a first region having a transmittance sufficient for transmitting the light emitted from the luminescent layer, and a second region having electrical conductivity higher than that of the first region, wherein the first region and the second region are arranged in a direction parallel to the luminescent layer.

14. The organic EL element of claim 13, wherein:

the first region has a first thickness; and the second region has a second thickness larger than the first thickness.

15. The organic EL element of claim 13, wherein:

the first region is made of a first metallic material; and the second region is made of a second metallic material different from the first metallic material.

16. The organic EL element of claim 13, wherein:

the first region is made of a first metallic material; and the second region is made of a second metallic material identical with the first metallic material.

17. The organic EL element of claim 1, wherein:

the cathode has a part that is composed of only the thin film region in a direction perpendicular to the luminescent layer; and the light emitted from the luminescent layer passes through the part of the cathode.

18. The organic EL element of claim 8, wherein an area of the first metallic layer uncovered with the second metallic layer is larger than an area of the second metallic layer.

19. The organic EL element of claim 12, wherein:

the cathode has a part that is composed of only the first region in a direction perpendicular to the luminescent layer; and the light emitted from the luminescent layer passes through the part of the cathode.

20. An organic EL element comprising:

an anode composed of a transparent conductive material layer;

a cathode composed of a metallic layer; and a luminescent layer composed of an organic compound layer and disposed between the anode and the cathode, wherein the cathode has a first part composed of only a single metallic layer in a direction perpendicular to the luminescent layer and a second part composed of at least two metallic layers laminated with one another in the direction perpendicular to the luminescent layer.

21. The organic EL element of claim 20, wherein a ration in area of the second part with respect to a light emitting region of the luminescent layer is less than approximately 70%.

22. The organic EL element of claim 20, wherein the organic compound layer is comprised of an organic main material having an electron transporting property and a fluorescent material doped into the main material.

23. The organic EL element of claim 22, wherein the fluorescent material is comprised of 4-dicyanomethylene-2-methyl-6-(p-dimethylaminostyryl)-4H-pyr-an.

24. The organic EL element of claim 22, wherein the fluorescent material is comprised of quinacridone.

25. The organic EL element of claim 22, wherein the main material is made of 8-quinolinol aluminum complex.

* * * * *

UNITED STATES PATENT AND TRADEMARK OFFICE
CERTIFICATE OF CORRECTION

PATENT NO.     : 6,356,032 B1
DATED          : March 12, 2002
INVENTOR(S)    : Harumi Suzuki and Masao Nagakubo It is certified that error appears in the above-identified patent and that said Letters Patent is hereby corrected as shown below:

<u>Title page,</u>
Item [54], Title, "ORGANIC ELEMENT WITH METALLIC CATHODE" to be
-- ORGANIC EL ELEMENT WITH METALLIC CATHODE --

Signed and Sealed this

First Day of June, 2004

JON W. DUDAS
*Acting Director of the United States Patent and Trademark Office*